(12) United States Patent
Lyu et al.

(10) Patent No.: US 6,878,570 B2
(45) Date of Patent: Apr. 12, 2005

(54) THIN STACKED PACKAGE AND MANUFACTURING METHOD THEREOF

(75) Inventors: Ju Hyun Lyu, Asan (KR); Kwan Jai Lee, Cheonan (KR); Tae Je Cho, Suwon (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/901,041

(22) Filed: Jul. 29, 2004

(65) Prior Publication Data

US 2005/0003581 A1 Jan. 6, 2005

Related U.S. Application Data

(62) Division of application No. 09/534,648, filed on Mar. 23, 2000.

(30) Foreign Application Priority Data

Sep. 27, 1999 (KR) ........................................ 1999-41271

(51) Int. Cl.⁷ .......................... H01L 21/44; H01L 21/48; H01L 21/50
(52) U.S. Cl. ....................... 438/106; 438/109; 438/112; 438/113; 438/123; 438/124; 438/127
(58) Field of Search ................................. 438/106, 109, 438/111–114, 123, 124, 127

(56) References Cited

U.S. PATENT DOCUMENTS

| | | | |
|---|---|---|---|
| 4,763,188 A | 8/1988 | Johnson | |
| 4,996,587 A | 2/1991 | Hinrichsmeyer et al. | |
| 5,138,438 A | 8/1992 | Masayuki et al. | |
| 5,172,303 A | 12/1992 | Bernardoni et al. | |
| 5,198,888 A * | 3/1993 | Sugano et al. | 257/686 |
| 5,471,088 A * | 11/1995 | Song | 257/668 |
| 5,677,569 A | 10/1997 | Choi et al. | |
| 5,744,827 A | 4/1998 | Jeong et al. | |
| 5,770,888 A | 6/1998 | Song et al. | |
| 5,821,615 A * | 10/1998 | Lee | 257/686 |
| 5,834,831 A | 11/1998 | Kubota et al. | |
| 6,046,504 A | 4/2000 | Kimura | |
| 6,075,284 A * | 6/2000 | Choi et al. | 257/676 |
| 6,337,510 B1 * | 1/2002 | Chun-Jen et al. | 257/666 |
| 6,476,476 B1 * | 11/2002 | Glenn | 257/686 |
| 6,630,729 B2 * | 10/2003 | Huang | 257/676 |
| 6,710,246 B1 * | 3/2004 | Mostafazadeh et al. | 174/52.3 |
| 6,723,585 B1 * | 4/2004 | Tu et al. | 438/123 |
| 6,730,544 B1 * | 5/2004 | Yang | 438/110 |
| 6,812,063 B2 * | 11/2004 | Huang | 438/110 |
| 2001/0040286 A1 * | 11/2001 | Fujimoto et al. | 257/692 |
| 2002/0100963 A1 * | 8/2002 | Suzuki et al. | 257/678 |

FOREIGN PATENT DOCUMENTS

KR 1998-082949 A 5/1998

* cited by examiner

*Primary Examiner*—John F. Niebling
*Assistant Examiner*—Angel Roman
(74) *Attorney, Agent, or Firm*—Harness, Dickey & Pierce, P.L.C.

(57) ABSTRACT

There are disclosed a stacked package formed by stacking semiconductor device packages and a manufacturing method thereof. Each package includes leads and connection terminals. A semiconductor chip is electrically connected to the connection terminals. A package body has the same thickness as that of the lead so as to expose the upper and the lower surfaces of the leads to the package body. Each of the packages is stacked on another package by electrically connecting the exposed upper and lower surfaces of the leads with each other. The manufacturing method has preparing lead frames, attaching an adhesive tape to the lower surface of the lead frame, bonding a semiconductor chip to the adhesive tape in the chip receiving cavity between the leads, connecting the semiconductor chip to the connection terminals, forming a package body, removing the adhesive tape; removing dam bars from the side frame, separating packages from the lead frame, and forming a stacked package by stacking a plurality of the packages.

12 Claims, 16 Drawing Sheets

THIN STACKED PACKAGE AND MANUFACTURING METHOD THEREOF

This invention relates to a method for manufacturing a thin stacked package, and is a divisional of application Ser. No. 09/534,648, filed Mar. 23, 2000, now allowed, the entire contents of which are incorporated by reference.

BACKGROUND OF THE INVENTION

1. Field of the Invention

The present invention generally relates to semiconductor devices and method for manufacturing the same, and more particularly to stacking structures of semiconductor integrated circuit packages and method for manufacturing the packages.

2. Description of the Related Arts

In general, semiconductor dies or chips are individually packaged for use in plastic or ceramic packages. A plurality of outer leads protruding from the package body are soldered on a supporting substrate such as a printed circuit board, or inserted into a socket. These packages, especially the packages inserted into the socket, have a large mounting area occupied on the printed circuit board.

The printed circuit board is being developed toward a smaller size and a higher density, and thereby requires a higher-densely packaging technique. Therefore, a multichip module or package capable of supporting several chips on a single package, has been developed.

The MCM or the MCP decreases the time delay between the chips, the electrical noise, and the crosstalk. Further, the MCM can employ much larger-sized chips, increase the number of I/O leads, and improve package mounting density to the substrate.

However, the above-described MCM has several drawbacks. Bare silicon chips for MCM cannot be tested before the chips are packaged. And, any one chip that is not operant causes the entire module to fail test. Thus, the MCM is faced with poor yields and little chance of rework. In addition, that MCM technology is not commonly available to burn-in bare silicon chips; burn-in must be done at the module level.

A stacked package has been introduced as an alternative to the MCM. The stacked package not only reduces its overall size, but also allows for chip-level tests or burn-in before packaging. These three-dimensional stacked packages are disclosed in, for example, U.S. Pat. Nos. 5,138,438, 5,172,303, 5,193,888, and 4,763,188. Since the stacked package can improve the mounting density to the substrate and connecting density between the packages, it is applicable in a super computer, a large-scale cash memory, and so on.

However, since individual packages for the stacking structure are much thicker in thickness than the chips therein, the overall thickness of the stacked package considerably increases. It is therefore required in the art to reduce the thickness of the packages and to realize thinner stacked packages.

Moreover, the stacked package needs to deform or bend the package leads in order to interconnect upper and lower packages, and thereby reduces the yield of the stacked package. For example, the outer leads of an upper package are inserted to the outer leads of a lower package, or additional connectors are inserted to via holes formed through the outer leads of individual packages so as to be served as external connection terminals.

SUMMARY OF THE INVENTION

Accordingly, an object of the present invention is to provide thin semiconductor stacked packages. Another object is to allow for the testing of the individual packages of the stacked package. Still another object is to increase the yield of the stacked package by eliminating additional leads deformation and/or treatment.

The foregoing and other objects are achieved by a stacked package formed by stacking a plurality of semiconductor device packages, each package comprising a plurality of leads including inner leads having a designated thickness, and connection terminals having a smaller thickness than that of the inner leads, a semiconductor chip electrically connected to the connection terminals so that a lower surface of said chip is coplanar with the lower surface of the inner leads and the chip has the same thickness as that of the connection terminals, a package body formed by encapsulating the semiconductor chip, the inner leads, the connection terminals and electrical connection parts between the semiconductor chip and the connection terminals, so that said package body has the same thickness as that of the inner leads so as to expose the upper and the lower surfaces of the inner leads to the package body. Herein each of the packages is stacked on another package by electrically connecting the exposed upper and lower surfaces of the inner leads with each other.

A lowermost package further comprises a plurality of outer leads integrated with the inner leads, said outer leads protruding from the package body and bent to be mounted on an external printed circuit board. The connection terminals are formed by half-etching the upper surfaces of the terminal ends of the inner leads. The semiconductor chip is electrically connected to the connection terminals of the inner leads by a metal wire and a depth of the half-etching is greater than a wire loop height so that the metal wire is embedded by the molded package body. The metal wire is wedge-bonded to the semiconductor chip and the connection terminals of the inner leads, respectively. Alternatively, the semiconductor chip is electrically connected to the connection terminals of the inner leads by metal bumps. The exposed upper and lower surfaces of the inner and the surfaces of the outer leads are plated with a Sn-Pb alloy.

In another aspect, the present invention is provided by a method for manufacturing stacked packages by stacking a plurality of semiconductor device packages, said method comprising: preparing leads frames, each lead frame including: a chip receiving cavity; a plurality of inner leads having a designated thickness; a plurality of connection terminals having a smaller thickness than that of the inner leads; a plurality of outer leads integrated with the inner leads; dam bars; tie bars; and a side frame; attaching an adhesive tape to the lower surface of the lead frame; bonding a semiconductor chip to the adhesive tape in the chip receiving cavity between the leads; connecting the semiconductor chip to the connection terminals; forming a package body by encapsulating the semiconductor chip, the inner leads, the connection terminals, and electrical connection parts between the semiconductor chip and the connection terminals, so as to expose the upper surfaces of the inner leads to the package body; removing the adhesive tape; removing dam bars from the side frame; separating packages from the lead frame; and forming a stacked package by stacking a plurality of the packages. Herein, each of the packages is stacked on another package by electrically connecting the exposed lower surfaces of the inner leads of one package to the exposed upper surfaces of the inner leads of another package, and the stacked package is electrically connected to an external printed circuit board by the outer leads of a lowermost package.

BRIEF DESCRIPTION OF THE DRAWINGS

The various features and advantages of the present invention will be readily understood with reference to the following detailed description taken in conjunction with the accompanying drawings, wherein the reference numerals designate like structural elements, and, in which:

FIG. 5 is a perspective view of a lead frame having an adhesive tape attached thereto;

FIG. 6 is a perspective view of the lead frame having a semiconductor chip attached thereon;

FIG. 7 is a perspective view showing wire bonding;

FIG. 8 is a perspective view of a molded package body;

FIG. 9 is a perspective view showing a removal of the adhesive tape;

FIG. 10 is a perspective view showing a removal of the dam bars;

FIG. 11 is a perspective view showing the separating of the semiconductor device package of FIG. 2 from the lead frame by cutting the outer leads and the tie bars; and FIG. 12 is a perspective view showing the separating of the semiconductor device package of FIG. 3 from the lead frame by cutting the inner leads and the tie bars;

DETAILED DESCRIPTION OF THE PREFERRED EMBODIMENTS

Preferred embodiments of the present invention will be described below with reference to the accompanying drawings.

Figure 1:
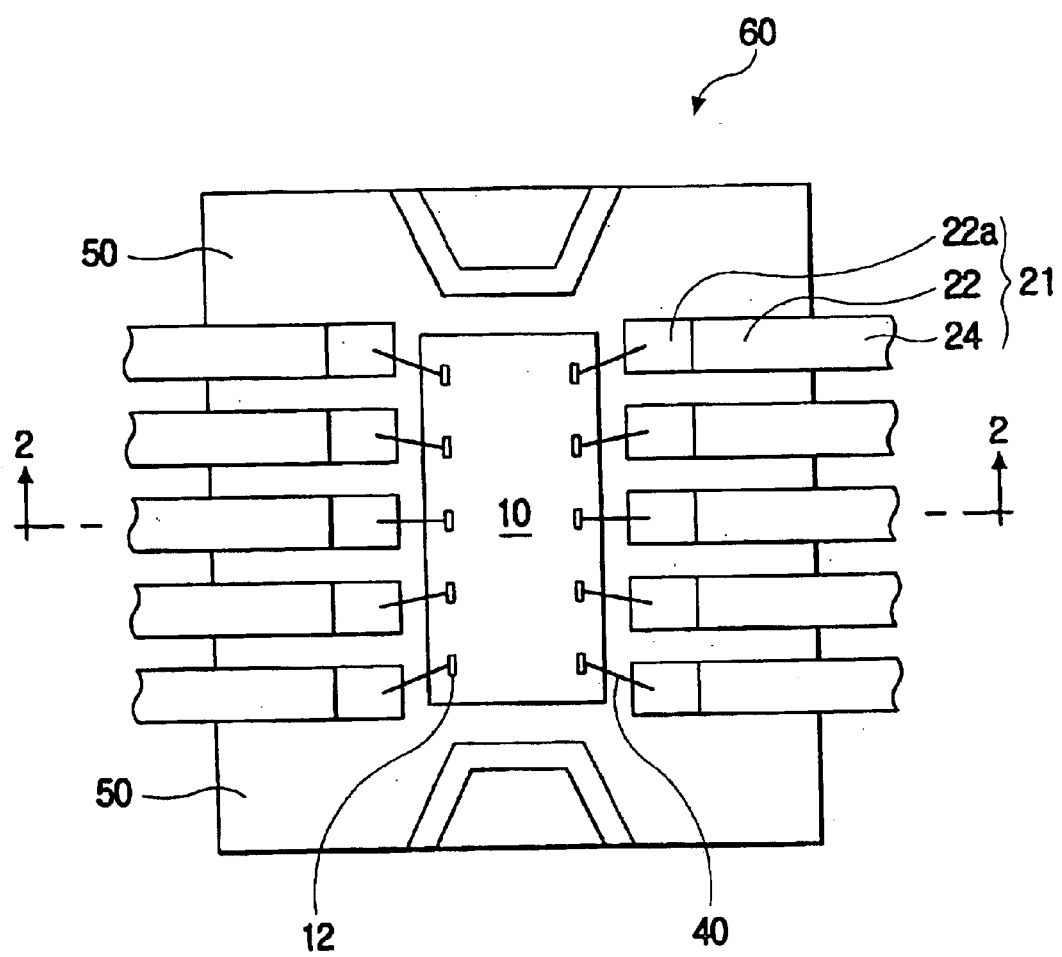
FIG. 1 is a plan view of a semiconductor device package according to a first embodiment of the present invention.
Figure 2:
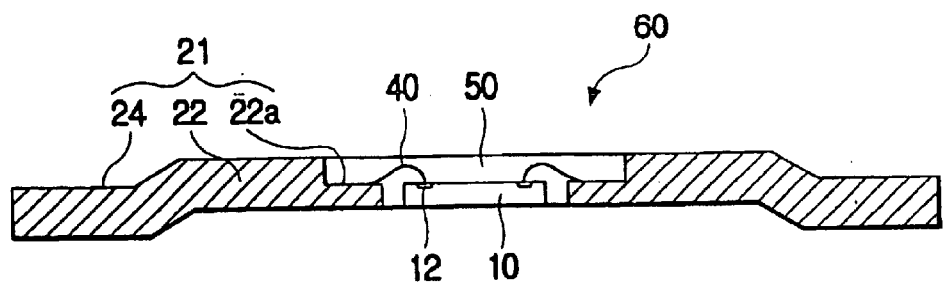
FIG. 2 is a cross-sectional view, taken along the line 2—2 of FIG. 1, of the semiconductor device package having outer leads to be bent in gull wing type.

FIG. 1 is a plan view of a semiconductor device package 60 according to a first embodiment of the present invention. FIG. 2 is a cross-sectional view, taken along the line 2—2 of FIG. 1, of the package having a plurality of outer leads to protrude from the package body and to be bent in gull-wing type.

Referring to FIGS. 1 and 2, the semiconductor device package 60 comprises a semiconductor chip 10, a plurality of leads 21 electrically connected to the semiconductor chip 10 via a metal wire 40, and a package body 50 encapsulating the semiconductor chip 10 and the metal wire 40 with a resin compound.

The semiconductor chip 10 is an edge pad type chip having a plurality of electrode pads 12 on opposite edges of its active surface. Although the current embodiment uses the edge pad type chip 10, a center pad type chip or a center and edge pads combined type chip may be used.

The leads 21 have inner leads 22 which are embedded in the package body 50, and outer leads 24 which protrude from the package body 50. Each inner lead 22 is integrated with the corresponding outer lead 24. The leads 21 are arranged along opposite two sides of the semiconductor chip 10 and spaced from the sides. The lead 21 has the same thickness as the overall thickness of the package body 50. The current embodiment uses dual-type leads. However, quad-type leads may be used as an alternative.

FIG. 2 shows the semiconductor device package 60 having the outer leads 24 protruding from the package body 50 and bent in gull-wing type. The bent portions of the outer leads 24 serve as external contacts electrically connected to a printed circuit board. The upper surfaces of the inner leads 22, exposed to the upper surfaces of the package body 50, serve as internal contacts electrically connected to the lower surfaces of the inner leads 22 of another semiconductor device package 60a of FIG. 3.

The lower surface of the semiconductor chip 10 is exposed to the lower surface of the package body 50. That is, the lower surface of the semiconductor chip 10 is coplanar to that of the package body 50. The exposure of the chip facilitates to dissipate heat generated in the chip.

Connection terminals 22a of the inner leads 22 are half-etched. It is preferable that the depth of the half-etching is greater than the wire loop height.

To lower the wire loop height, the metal wires 40 are wedge-bonded to both the semiconductor chip 10 and the inner leads 22.

In an exemplary embodiment, the semiconductor chip has a 100 $\mu$m thickness and the wire has a 25 $\mu$m thickness. In this case, the thickness of the package can be reduced to 200 $\mu$m by using 200 $\mu$m thick leads. Preferably, the inner leads are half-etched to have the same height of 100 $\mu$m as the thickness of the semiconductor chip 10. If the metal wire 40 is connected to the electrode pads 12 and the connection terminals 22a by the wedge bonding method, it is possible to lower the wire loop height up to approximately 50 $\mu$m, that is, double of the diameter of the metal wire 40.

In an alternate embodiment, the metal wires 40 are wedge-bonded to the inner leads 22 and ball bonded to the semiconductor chip 10.

In this case, the wire loop height should be controlled within the depth of the half-etching of the leads.

Figure 3:
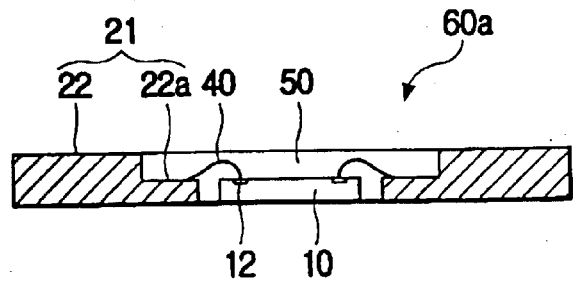
FIG. 3 is a cross-sectional view of another semiconductor device package lacking outer leads according to the first embodiment of the present invention.

A semiconductor device package 60a of FIG. 3 has a form of removing the outer leads 24 from the package body 50 of the semiconductor device package 60 of FIG. 2. Depending on the treatment of the outer leads 24, the semiconductor device package 60 in FIG. 2 or the semiconductor device package 60a in FIG. 3 may be alternatively formed. Herein, inner leads 22 are exposed to the upper, the lower, and the side surfaces of the package body 50. The exposed upper and lower surfaces of the inner leads 22 serve as internal contacts electrically connected to the exposed upper and lower surfaces of the inner leads 22 of other semiconductor device packages 60 or 60a in stacking the packages. The semiconductor device package 60 of FIG. 2 is disposed on the lowermost of the stacked package, and the semiconductor device packages 60a of FIG. 3 are successively stacked on the lowermost semiconductor device package 60 of FIG. 2.

Figure 4:
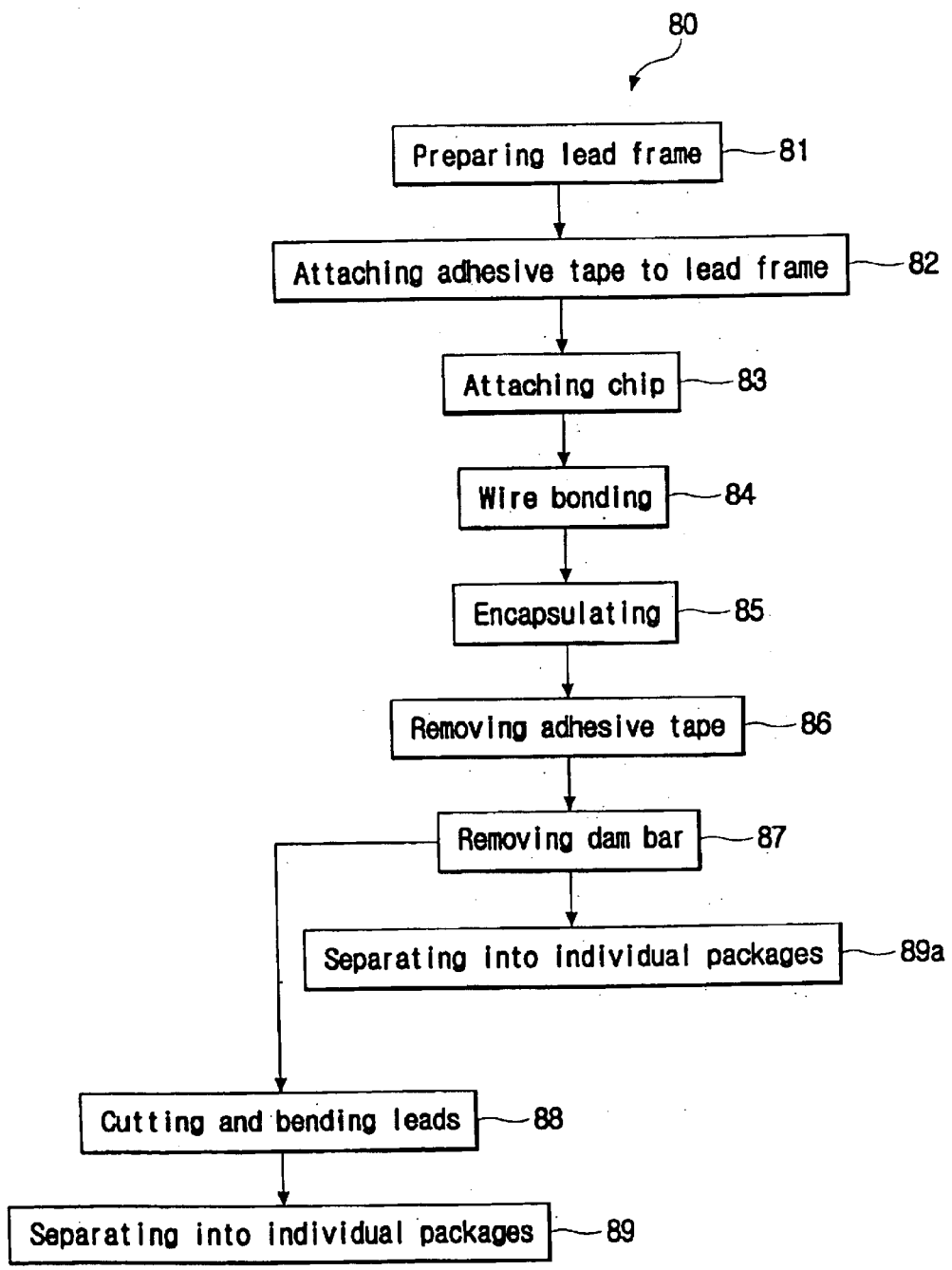
FIG. 4 is a flow chart illustrating a method for manufacturing the semiconductor device packages according to the first embodiment of the present invention.
Figure 11:
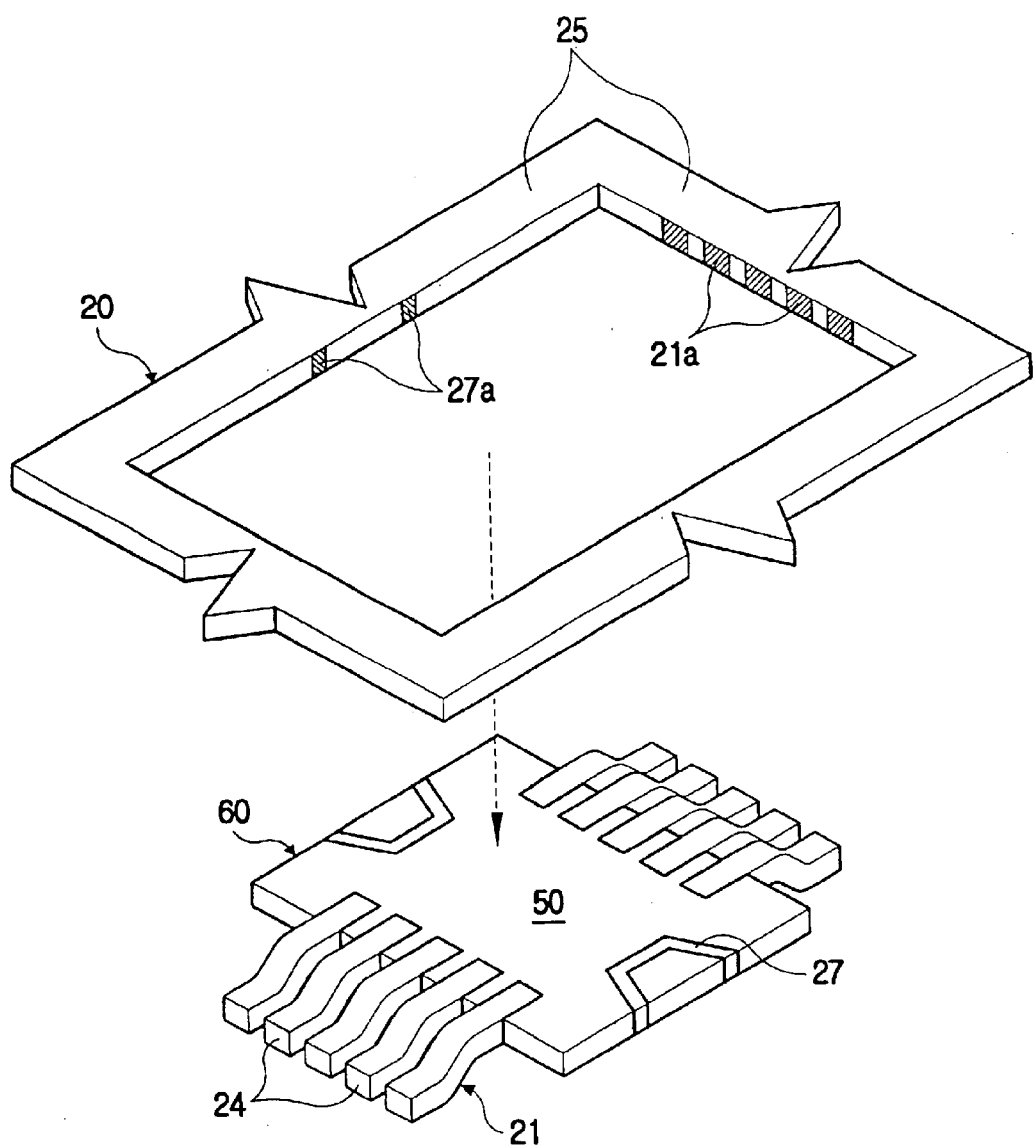
Figure 12:
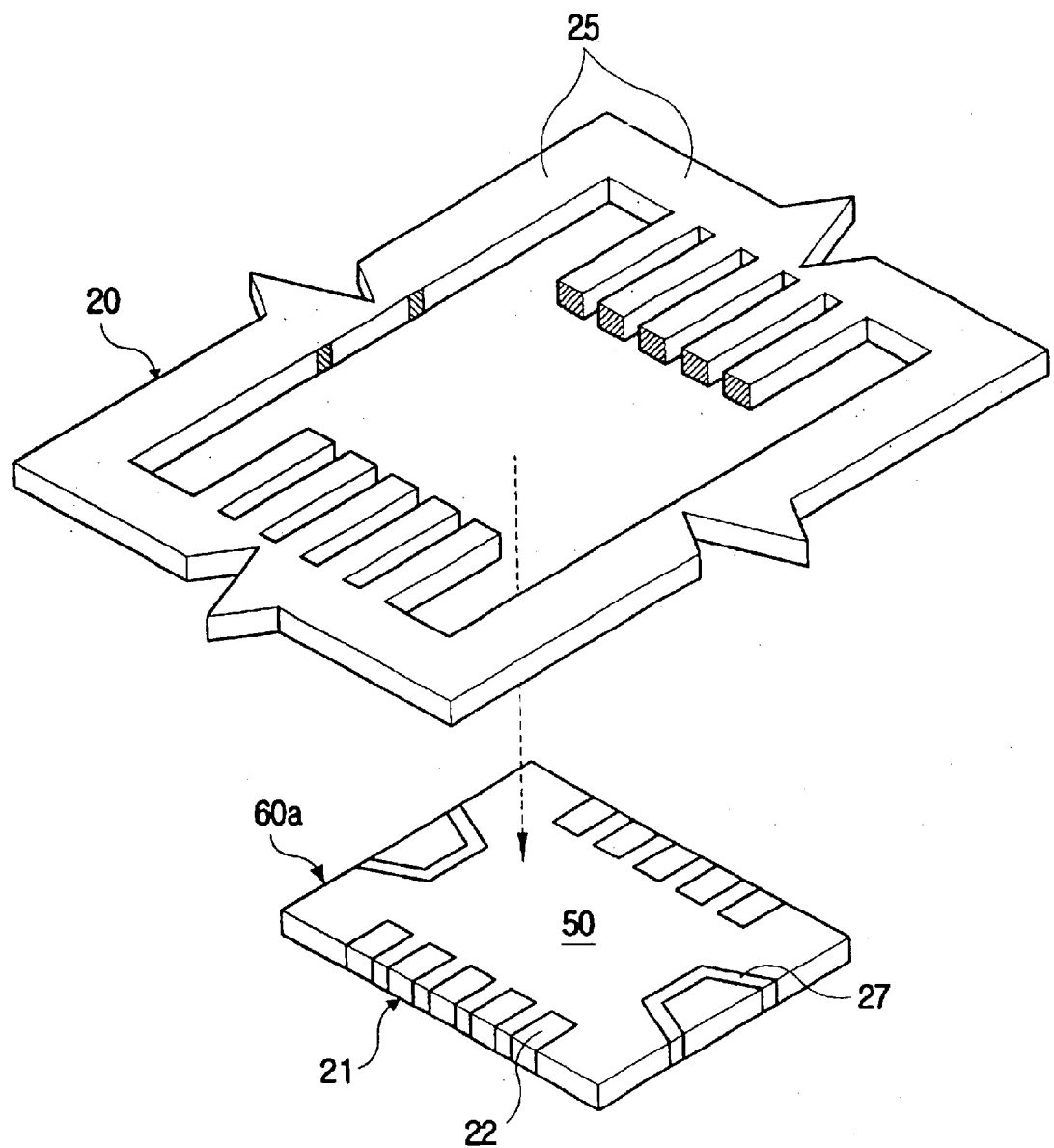
Figure 13:
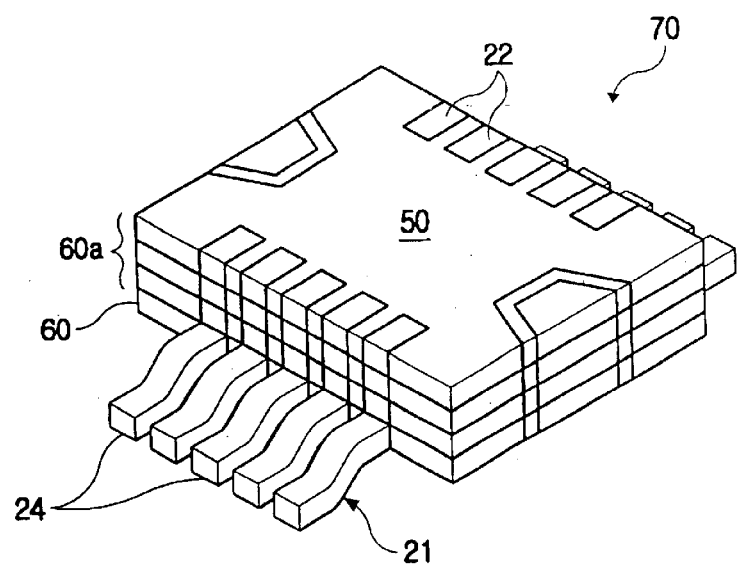
FIG. 13 is a perspective view of a stacked package formed by stacking a plurality of the semiconductor device packages of the first embodiment.

FIG. 4 is a flow chart 80 illustrating a method for manufacturing the semiconductor device packages according to the first embodiment of the present invention. FIGS. 5 to 12 illustrate each step of the manufacturing method of FIG. 4, and FIG. 13 shows a stacked package formed by stacking a plurality of the semiconductor device packages.

FIGS. 5 to 11 illustrate a method for manufacturing the semiconductor device package 60 of FIG. 2, and FIGS. 5 to 10 and 12 illustrate a method for manufacturing the semiconductor device package 60a of FIG. 3. That is, FIGS. 5 to 10 are common steps in manufacturing the semiconductor device packages 60 and 60a.

Figure 5:
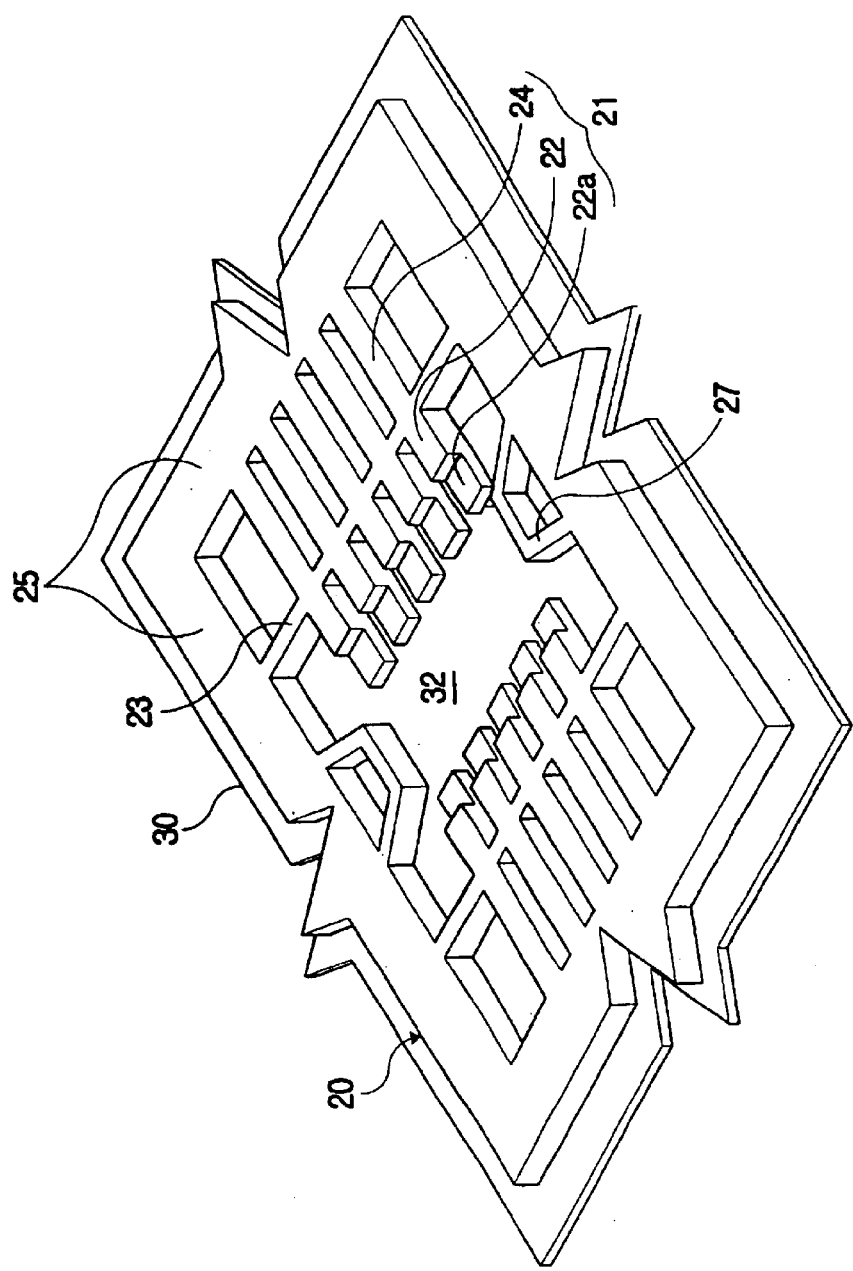
FIGS. 5 to 12 illustrate each step of the manufacturing method of FIG. 4.

Referring to FIG. 5, a lead frame 20 patterned by etching or stamping a lead frame material which is made of a copper (Cu) or an iron (Fe) alloy is prepared. (step 81) The lead frame 20 comprises a chip receiving cavity 32, a plurality of leads 21, dam bars 23, tie bars 27, and a side frame 25. The leads 21 are arranged along opposite two sides of the chip receiving cavity 32 and spaced from the sides at a designated distance. The dam bars 23 are formed perpendicular to the leads 21 to partition the leads 21 into inner leads 22 and outer leads 24, and to block the flow of the molding resin during an encapsulating step. The tie bars 27 are formed on opposite two sides other than two sides on which the leads 21 are formed. The leads 21, the dam bars 23, and the tie bars 27 are supported by a side frame 25.

Connection terminals 22a are formed on terminal ends of the inner leads 22, which lie adjacent to the chip receiving cavity 32, by half-etching the inner leads 22.

Although the current embodiment describes one lead frame 20 for receiving one semiconductor chip, a lead frame strip comprising a plurality of lead frame units may be preferably used.

An adhesive tape 30 is attached to the lower surface of the lead frame 20.(step 82). The adhesive tape 30 serves to attach the semiconductor chip and to prevent the overflow of the molding resin into the space between the dam bars 23 and the side frame 25 in the encapsulating step such as the potting method.

Figure 6:
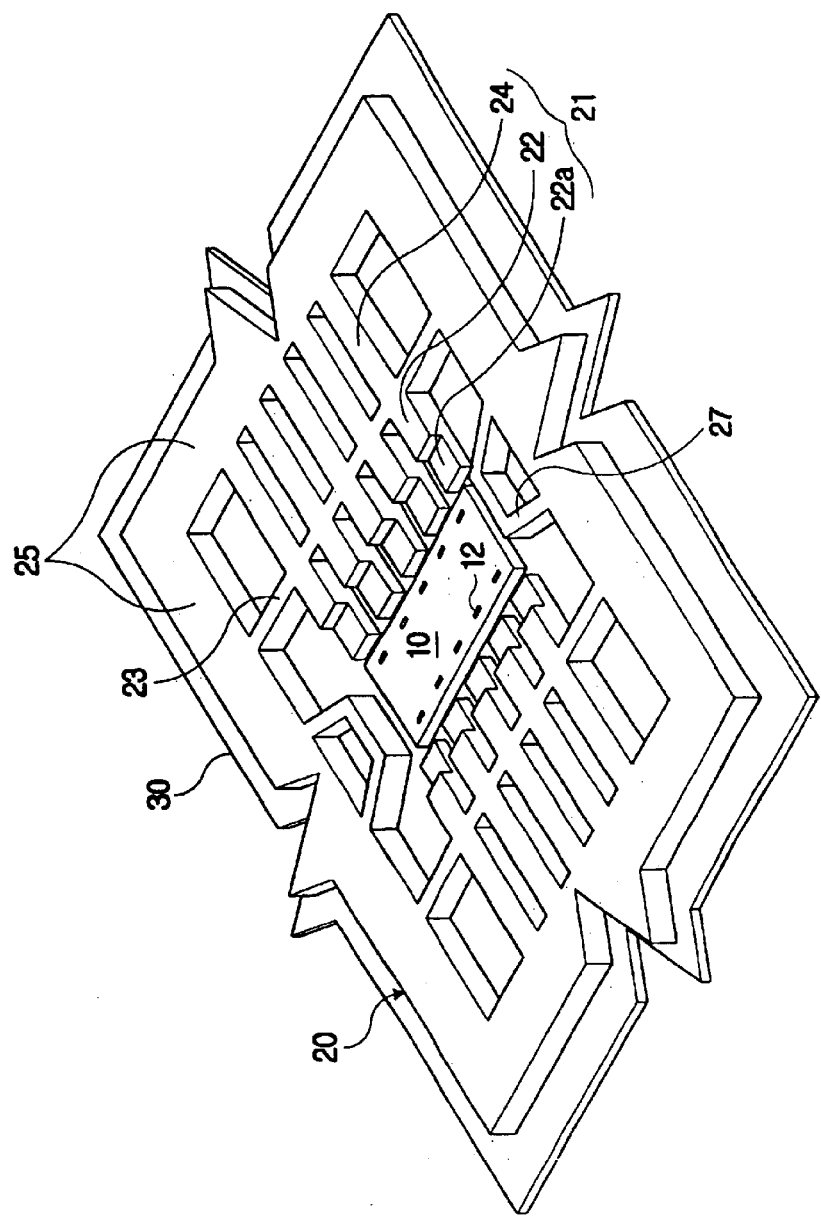

FIG. 6 shows a step 83 of attaching a semiconductor chip 10. The semiconductor chip 10 is attached to the adhesive tape 30 in the chip receiving cavity 32 between the inner leads 22.

In order to manufacture the semiconductor device package having the same thickness as that of the lead frame 20, it is preferable to use the lead frame having a greater thickness of that of the semiconductor chip 10. For instance, in case of the semiconductor chip 10 having a 100 μm thickness, a lead frame having a double thickness of that of the semiconductor chip 100, that is, approximately 200 μm is used.

Figure 7:
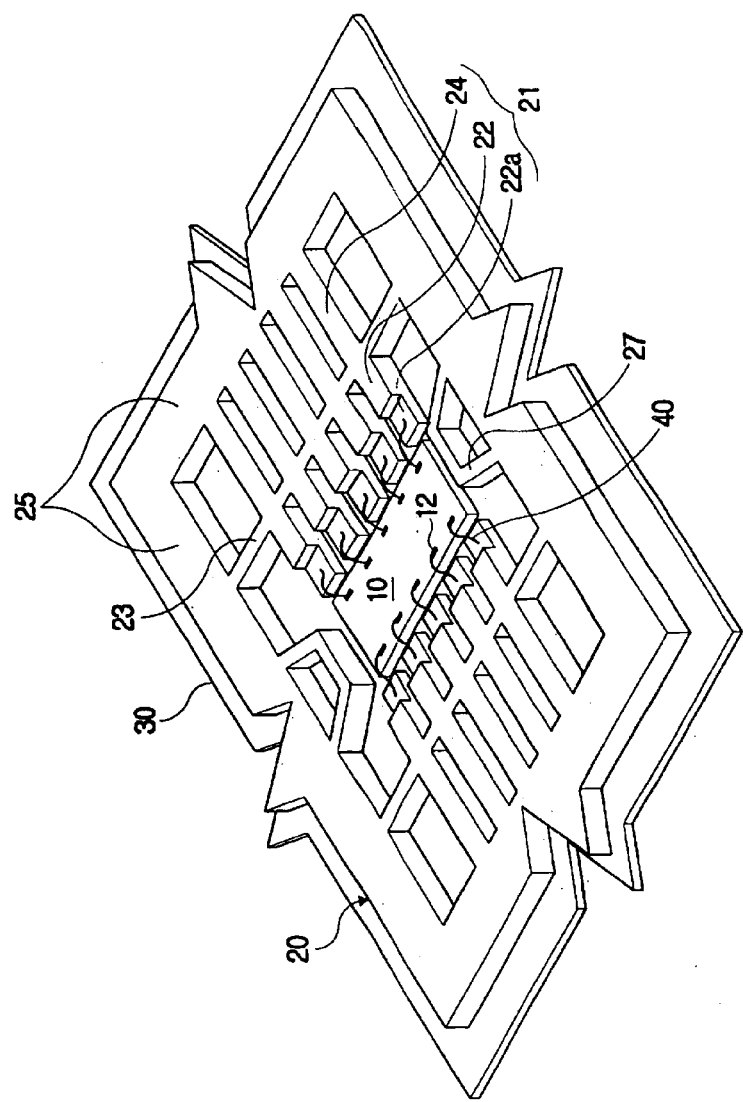

FIG. 7 shows a step 84 of electrically connecting the semiconductor chip 10 to the connection terminals 22a with a metal wire 40. Each connection terminals 22a of the inner lead 22 is wire-bonded to a corresponding electrode pad 12 of the semiconductor chip 10 via the metal wire 40 made of gold (Au) or aluminum (Al). To lower a wire loop height, the wedge-bonding method is employed. Alternatively, if wire loop height is controlled within the top of the package, the ball-bonding method on the electrode pads 12 of the semiconductor chip 10 and the wedge-bonding method on the connection terminals 22a may be used.

Figure 8:
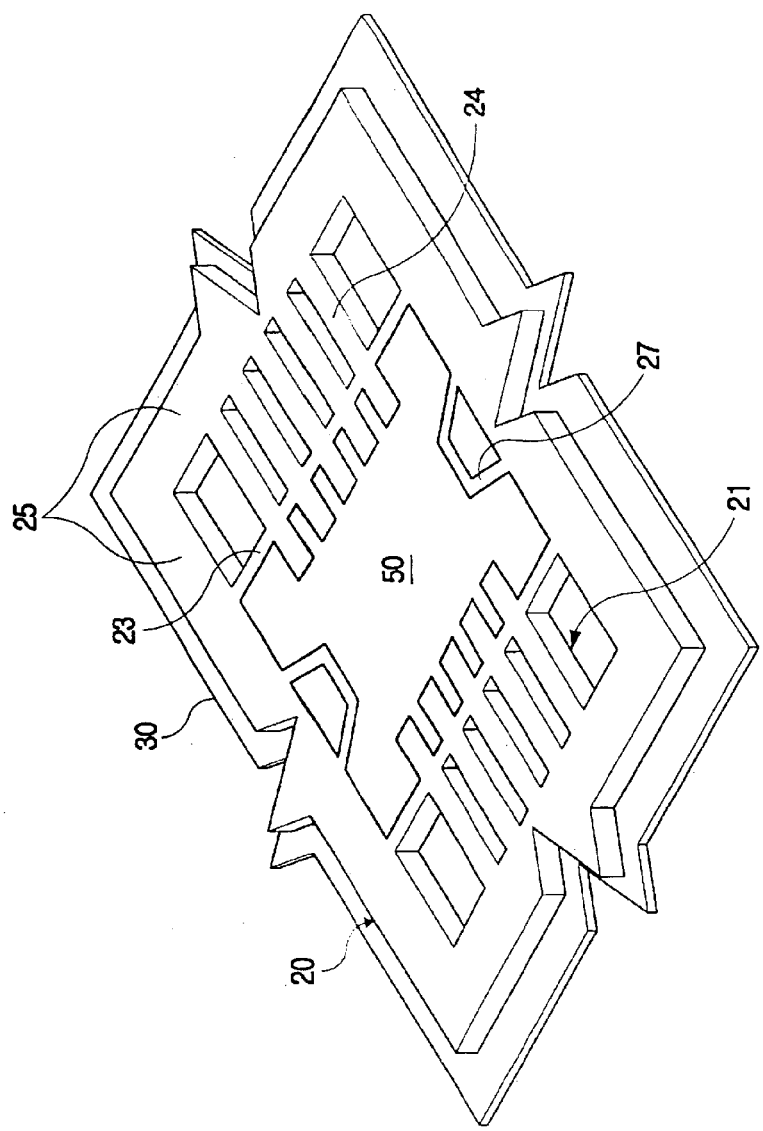

As shown in FIG. 8, the package body 50 is formed. (step 85) A liquid molding resin such as an epoxy molding compound (EMC) is injected and cured to form the package body 50. Herein, the upper surfaces of the inner leads 22 and the tie bars 27 are exposed to the upper surface of the package body 50. In order to form the package body 50 having the same thickness as that of the lead frame 20, it is preferable to use the transfer molding method and the potting method. In the transfer molding, the adhesive tape 30 serves as a lower mold while a flat upper mold is used. In the potting, the adhesive tape 30 prevents the leakage of the liquid resin.

Figure 9:
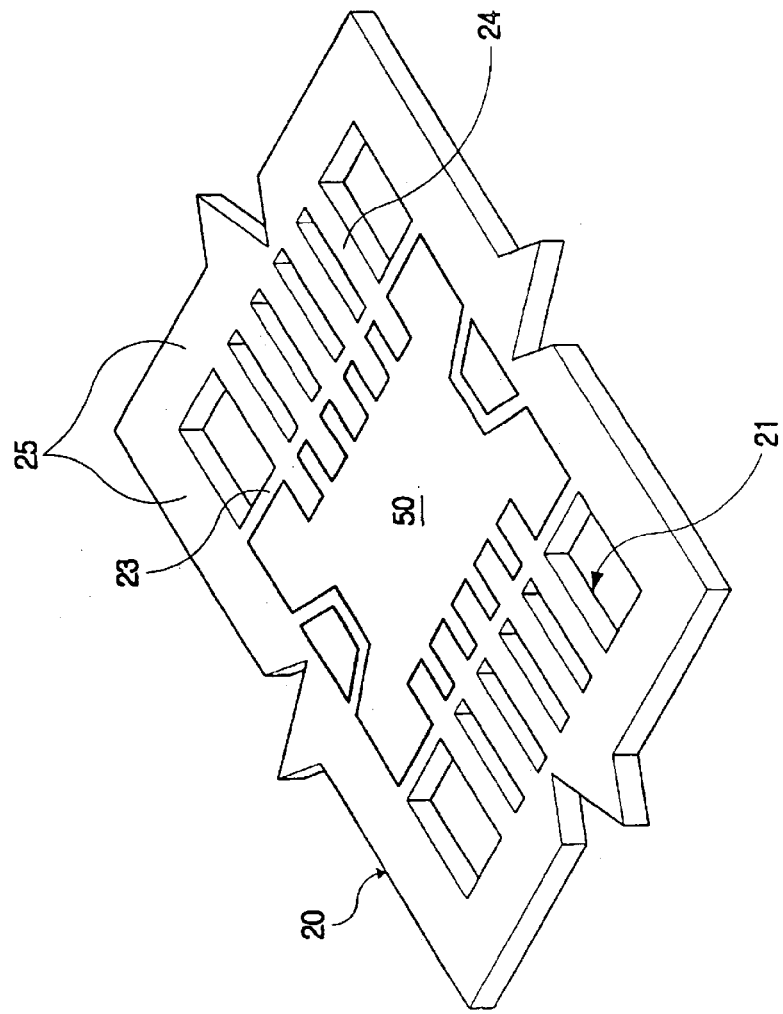
Figure 10:
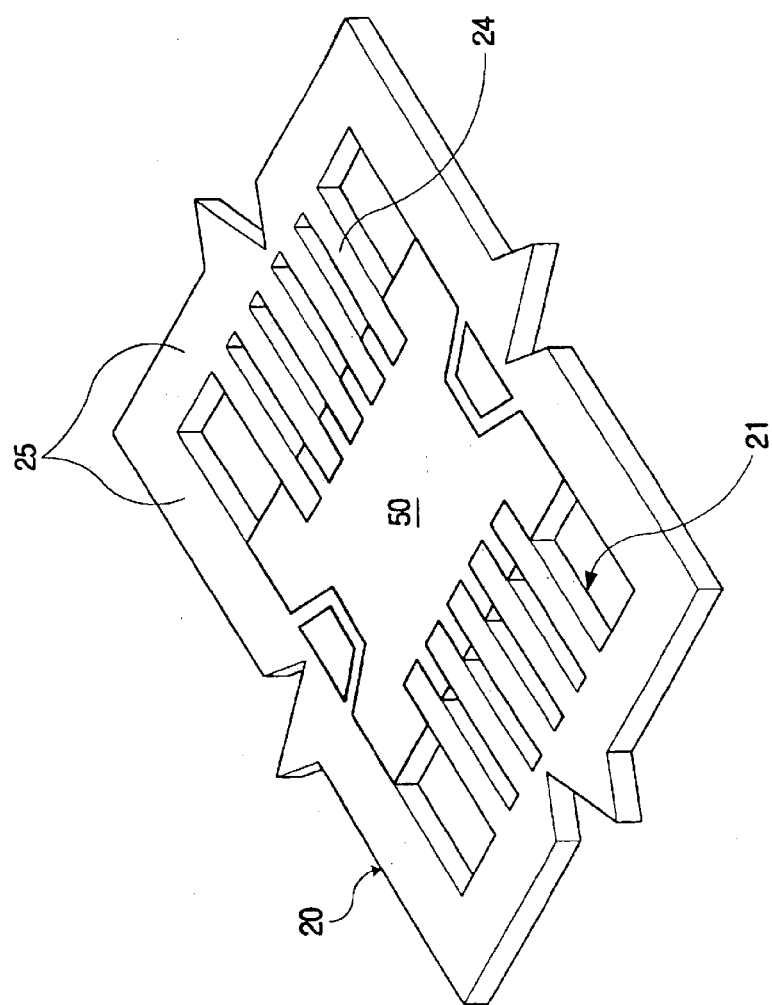

FIG. 9 shows a step 86 of removing the adhesive tape 30 from the lower surface of the lead frame 20. Thereby, the lower surfaces of the inner leads 22 and the tie bars 27 are also exposed to the lower surface of the package body 50. Then, FIG. 10 shows a step of 87 of removing the dam bars 23.

The above-described series of steps are common processes for manufacturing the semiconductor device packages 60 and 60a of FIGS. 2 and 3, respectively.

In order to manufacture the semiconductor device package 60 of FIG. 2, a following step is carried out. FIG. 11 shows a step 88 of cutting the outer leads 24 from the side frame 25 and bending the outer leads 24 to be mounted on a printed circuit board. For example, the outer leads 24 are bent in gull wing type. Then, the tie bars 27 are cut from the side frame 25. Thereby, individual semiconductor device packages 60 shown in FIG. 2 are separated from the side frame 25.(step 89) A reference numeral 27a refers to a trace of the cut tie bar 27 on the side frame 25, and a reference numeral 21a refers to a trace of the cut outer lead 24 on the side frame 25.

Alternatively, in order to manufacture the semiconductor device package 60a of FIG. 3, a following step is carried out after removing the dam bars 23. FIG. 12 shows a step 89a of separating individual semiconductor device packages 60a from the lead frame 20 by cutting the inner leads 22 from the outer leads 24 and by cutting the tie bars 27 from the side frame 25. Herein, a step of cutting the inner leads 22 and a step of cutting the tie bars 27 may be carried out simultaneously or sequentially.

After the step 87 of removing the dam bars 23, the exposed upper and lower surfaces of the inner leads 22 and the surfaces of the outer leads 24 can be plated with a Sn-Pb alloy. This plating improves the reliability of connections between the inner leads 22 and between the outer leads 24 and the printed circuit board in stacking the packages 60 and 60a. Prior to plating, it is preferable to carry out a deflashing step of removing the resin residues, i.e., flash from the surface of the outer leads 24. If a pre-plating lead frame is used, the above-described plating and deflashing steps may be omitted.

Referring to FIG. 13, a stacked package 70 is formed by stacking a plurality of the manufactured semiconductor device packages 60 and 60a according to the first embodiment. The semiconductor device package 60 having the bent outer leads 24 is placed on a lowermost position, and a plurality of the semiconductor device packages 60a lacking outer leads are successively stacked thereon. Although FIG. 13 depicts the stacked package 70 having one lowermost package 60 and three packages 60a, the stacked package 70 may comprise more than three packages 60a stacked thereon. The bent portions of the outer leads 24 of the lowermost package 60 serve as external contacts for mounting the stacked package 70 on the printed circuit board. The exposed upper and lower surfaces of the inner leads 22 of the packages 60 and 60a serve as internal contacts for electrically connecting the individual semiconductor device packages 60 and 60a to other package 60 and 60a.

The connection of the inner leads 22 between the semiconductor device packages 60 and 60a is described as follows. As described above, the Sn-Pb alloy plating layer is formed on the upper and lower surfaces of the inner leads 22, which are exposed to the upper and the lower surfaces of the package body 50. After stacking a plurality of the semiconductor device packages 60 and 60a, the exposed upper surfaces of the inner leads 22 of a lower package are electrically connected to the exposed lower surfaces of the inner leads 22 of an upper package by the reflow soldering at the temperature of approximately 180° C. or more.

Alternatively, in order to improve the adhesive strength between the inner leads 22, solder paste may be further used. After applying the solder paste on the exposed upper surfaces of the inner leads 22, a plurality of the packages 60, 60a are stacked and the inner leads 22 are electrically connected to each other by the reflow soldering. Herein, the solder paste is easily applied by the known screen printing method.

Figure 14:
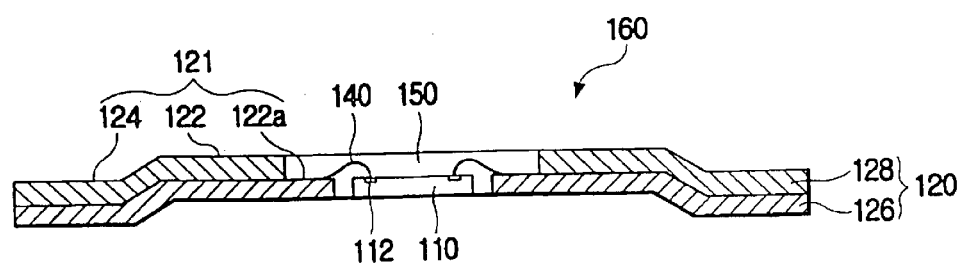
FIG. 14 is a cross-sectional view of a semiconductor device package having outer leads to be bent in gull wing type according to a second embodiment of the present invention.

FIG. 14 shows a semiconductor device package 160 having outer leads 124 protruding from the package body 150 and bent in gull wing type according to a second embodiment of the present invention.

With reference to FIG. 14, the semiconductor device package 160 comprises a lead frame 120 including a lower lead frame 126 and an upper lead frame 128 attached to the lower lead frame 126. The upper lead frame 128 is formed on the lower lead frame 126 except for terminal ends of the lower lead frame 162 which will be the connection terminals 122a. Other elements of the package 160 are identical with the package 60 of the first embodiment, and therefore their detailed descriptions are omitted.

According to the current embodiment, the connection terminals 122a are formed without the half-etching of the inner leads 122, and thereby the number of the manufacturing steps of the lead frame 120 can be reduced. First, the lower lead frame material is prepared. The upper lead frame material having an opening for exposing the connection terminal portions of the lower lead frame is attached to the lower lead frame material to manufacture the lead frame material 120. For a lead frame made of iron (Fe) having a melting point of 1,430 to 1,540° C., the upper lead frame 128 is attached to the lower lead frame 126 by heating with the temperature of approximately 800 to 1,300° C. at a designated pressure.

Figure 15:
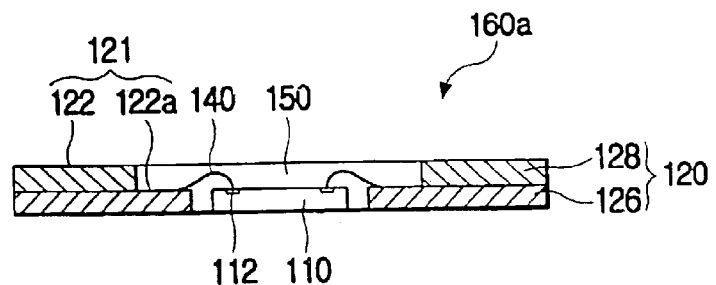
FIG. 15 is a cross-sectional view of another semiconductor device package lacking outer leads according to the second embodiment of the present invention.

FIG. 15 shows a semiconductor device package 160a having a form of removing the outer leads 124 from the package body 150 of the semiconductor device package 160 of FIG. 14. Depending on the treatment of the outer leads 124, the semiconductor device package 160 in FIG. 14 or the semiconductor device package 160a in FIG. 15 may be alternatively formed. Herein, inner leads 122 are exposed to the upper, the lower, and the side surfaces of the package body 150.

The manufacturing method of the semiconductor device packages 160 and 160a using the lead frame 120 of the second embodiment is the same as that of the first embodiment, and therefore the detailed description is omitted.

Figure 16:
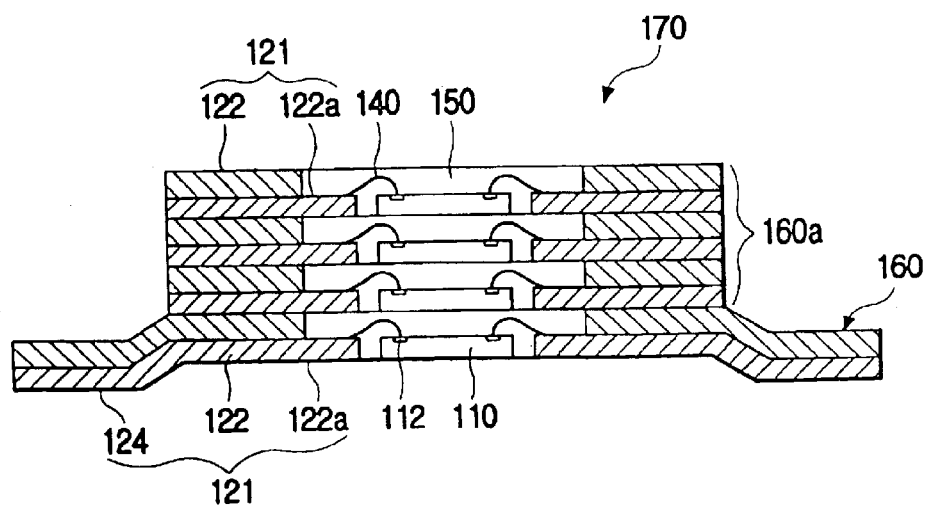
FIG. 16 is a cross-sectional view of a stacked package which is formed by stacking a plurality of the semiconductor device packages of the second embodiment.

As shown in FIG. 16, a stacked package 170 of a plurality of the semiconductor device packages 160 and 160a has the same configuration as the stacked package 70 of the first embodiment in FIG. 13. The semiconductor device package 160 having the bent outer leads 124 is placed on a lowermost position, and a plurality of the semiconductor device packages 160a lacking the outer leads are successively stacked thereon.

Figure 17:
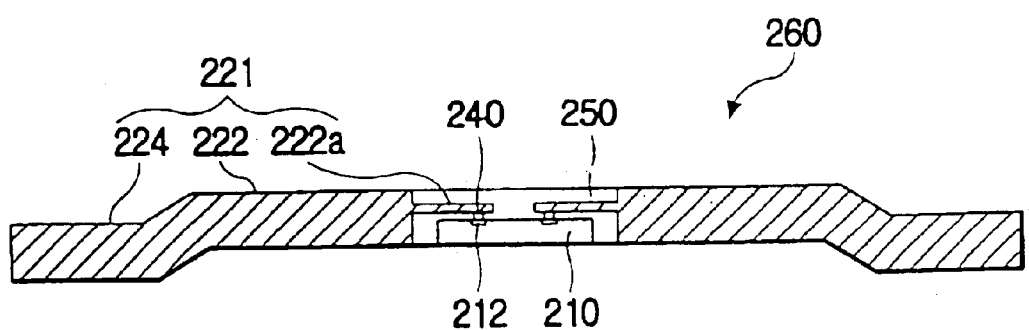
FIG. 17 is a cross-sectional view of a semiconductor device package having outer leads to be bent in gull wing type according to a third embodiment of the present invention.

FIG. 17 shows a semiconductor device package 260 having outer leads 224 protruding from the package body 250 and bent in gull wing type according to a third embodiment of the present invention.

With reference to FIG. 17, the semiconductor device package 260 comprises a semiconductor chip 210 having a plurality of electrode pads 212 thereon, metal bumps 240 on the electrode pads 212, a plurality of leads 221, and a package body 250 formed by encapsulating the chip 210, the metal bumps 240, and partially the leads 221 with a liquid molding resin.

The semiconductor chip 210 is an edge pad type chip having a plurality of the electrode pads 212 on opposite two edges of the active surface, and each of the metal bumps 240 is formed the respective electrode pad 212 and connects the chip 210 to the leads 221. The metal bumps 240 are formed by the known plating or wire bonding methods.

The leads 221 comprise a plurality of inner leads 222 embedded in the package body 250, and a plurality of outer leads 224 protruding from the package body 250, each inner lead 222 is integrated with the corresponding outer lead 224. Connection terminals 222a are formed by etching the upper and the lower surfaces of terminal ends of the inner leads 222, so that the semiconductor chip 210 is placed below the connection terminals 222a. Herein, the lower surface of the semiconductor chip 210 is coplanar to that of the inner leads 222.

Figure 18:
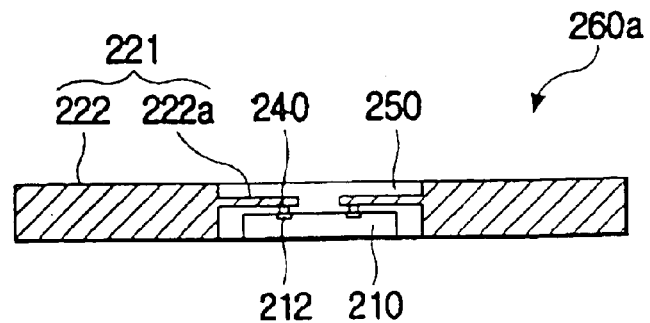
FIG. 18 is a cross-sectional view of another semiconductor device package lacking outer leads according to the third embodiment of the present invention.

FIG. 18 shows a semiconductor device package 260a having a form of removing the outer leads 224 from the package body 250 of the semiconductor device package 260 of FIG. 17. Depending on the treatment of the outer leads 224, the semiconductor device package 260 in FIG. 17 or the semiconductor device package 260a in FIG. 18 may be alternatively formed. Herein, inner leads 222 are exposed to the upper, the lower, and the side surfaces of the package body 250.

After forming the package body 250 by encapsulating the semiconductor chip 210 and the inner leads 222 including the connection terminals 222a, the lower surface of the semiconductor chip 210 is exposed to the lower surface of the package body 250. The connection terminals 222a are formed by etching the upper and the lower surfaces of the terminal ends of the inner leads 222. Herein, the lower surfaces are etched more deeply than the upper surfaces. Thereby, the semiconductor chip 210 can be attached to the lower surfaced of the connection terminals 222a by the metal bumps 240 on the electrode pads 212, and the lower surface of the semiconductor chip 210 is exposed to the lower surface of the package body 250.

For instance, in case of the semiconductor chip 210 in a thickness of 100 $\mu$m having the metal bumps 240, attached to the connection terminals 222a, in a height of 50 $\mu$m, the semiconductor device package 260 and 260a in a thickness of 200 μm can be provided by using the lead frame in a thickness of 200 μm. It is preferable to maintain the height from the lower surface of the inner lead 222 to the lower surface of the connection terminal 222a at approximately 150 μm.

Like other embodiments, in stacking a plurality of the packages 260 and 260a, the semiconductor device package 260 in FIG. 17 is placed on a lowermost position, and a plurality of the semiconductor device packages 260a in FIG. 18 are successively stacked thereon.

Figure 19:
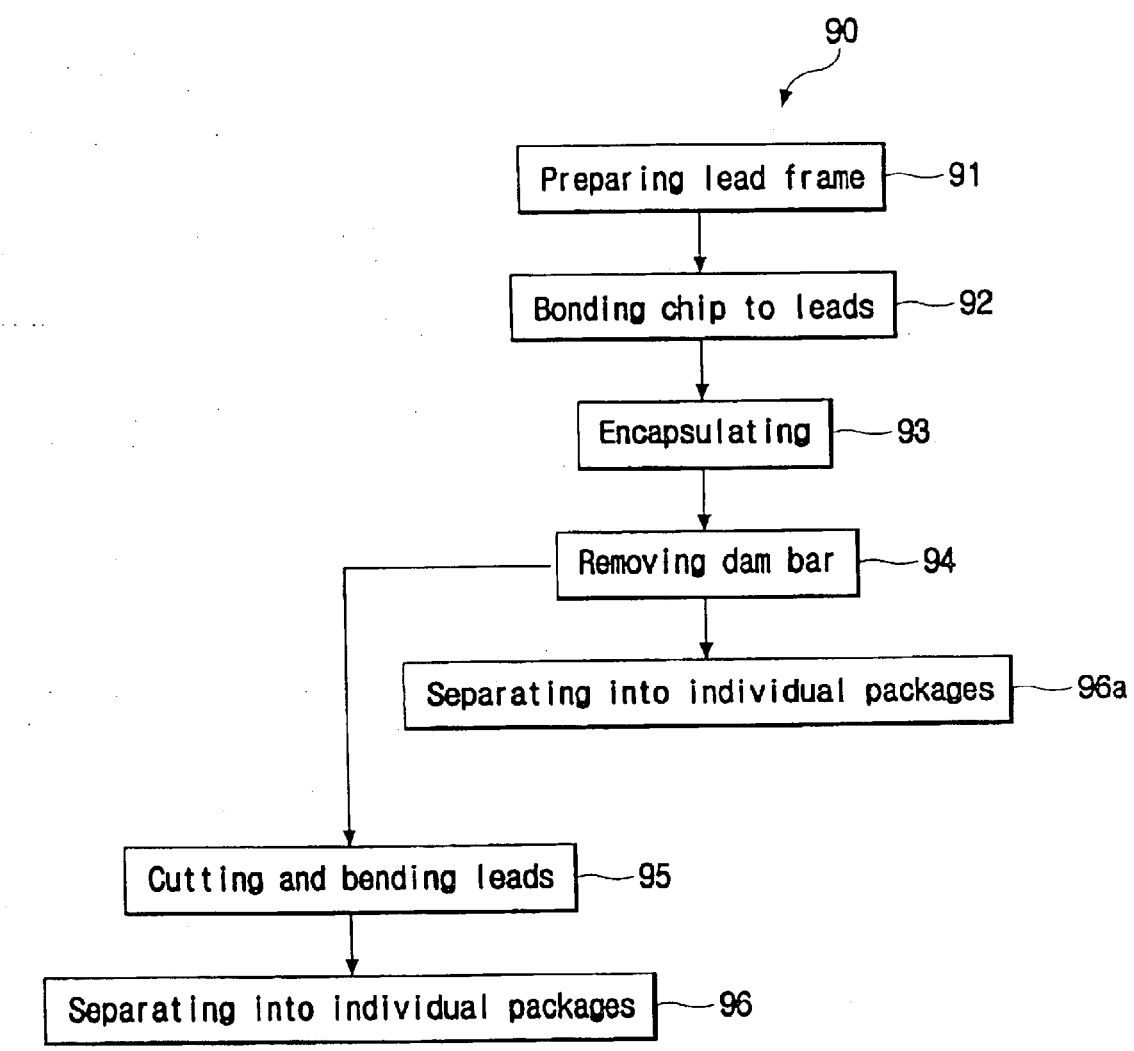
FIG. 19 is a flow chart illustrating a manufacturing method of the semiconductor device packages according to the third embodiment of the present invention.

FIG. 19 is a flow chart 90 illustrating a method 90 for manufacturing the semiconductor device packages according to the third embodiment of the present invention. Referring to FIG. 19, the manufacturing method 90 starts with a step 91 of preparing the lead frame having the connection terminals of the inner leads to be bonded to the metal bumps of the semiconductor chip. The lead frame of the current embodiment has the same as the lead frame 20 of FIG. 5 except for the connection terminals.

Without attaching the adhesive tape, the semiconductor chip is bonded to the lower surfaces of the connection terminals of the inner leads with the metal bumps on the chip.(step 92).

By an encapsulating step 93, the package body is formed by encapsulating the semiconductor chip, the inner leads and the connection terminals. As the encapsulating method, the known transfer molding method is preferably used. Alternatively, after attaching the adhesive tape to the lower surface of the lead frame and the semiconductor chip, the known potting method is used as the encapsulating method.

After the encapsulating step, the process for manufacturing the semiconductor device packages of the current embodiment is the same as that of the first embodiment. To manufacture the semiconductor device package 260 in FIG. 17, a step 94 of removing the dam bar, a step 95 of cutting the outer leads from the side frame and bending the outer leads to be mounted on an external printed circuit board, and a step 96 of separating individual semiconductor device packages from the lead frame by cutting the tie bars are successively carried out.

Alternatively, in order to manufacture the semiconductor device package 260a in FIG. 18, after the step 94 of removing the dam bars, a step 96a of separating individual semiconductor device packages by cutting the inner leads from the outer leads and the tie bars from the side frame is carried out.

Figure 20:
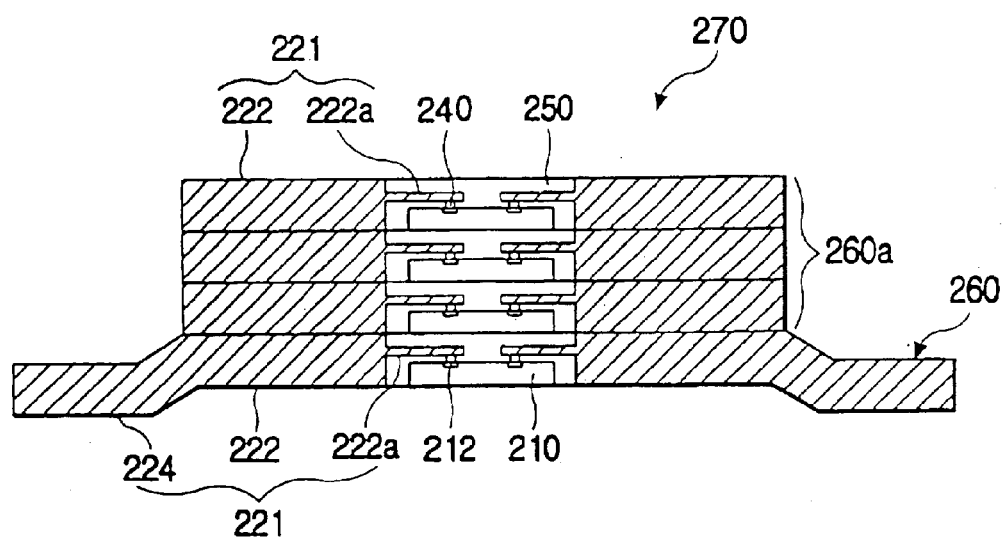
FIG. 20 is a cross-sectional view of a stacked package which is formed by stacking a plurality of the semiconductor device packages of the third embodiment.

FIG. 20 shows a stacked package 270 formed by stacking a plurality of the semiconductor device packages 260 and 260a according to the third embodiment. Except for the connection terminals 222a of the inner leads 222 bonded to the semiconductor chip 210 with the metal bumps 240 on the chip 210, the stacked package 270 has the same configuration as the stacked package 70 of the first embodiment.

Although the present invention describes the stacked package by stacking one lowermost package having the outer leads to be bent in gull wing type, and a plurality of the packages lacking outer leads stacked thereon, the stacked package may be formed by stacking only a plurality of the packages having the outer leads to be bent, or by stacking only a plurality of the packages lacking outer leads and attaching the solder balls to the lower surfaces of the inner leads of the lowermost package to be mounted on the external printed circuit board.

Further, if necessary, various packages in different types of the above-described several embodiments of the present invention can be stacked to form a stacked package.

According to the present invention, the packaging minimizes its overall thickness by making its thickness the same as the of the lead, that is the lead frame, and thereby forms thin stacked packages.

Since individual packages of the stacked package are interconnected to each other by electrically connecting the exposed upper and the lower surfaces of the inner leads, it is easy to manufacture the stacked package. And, the stacked package is mounted on the printed circuit board by electrically connecting the bent outer leads of the lowermost package to the printed circuit board. Therefore, the yield of the stacked package can be improved.

Further, since individual packages of the stacked package are manufactured by the conventional manufacturing method, additional equipment or steps are not required and the production cost is cut down.

Although preferred embodiments of the present invention have been described in detail hereinabove, it should be understood that many variations and/or modifications of the basic inventive concepts herein taught still fall within the spirit and scope of the present invention as defined in the appended claims.

What is claimed is:

1. A method for manufacturing stacked packages by stacking a plurality of semiconductor device packages, said method comprising:

preparing lead frames, each lead frame including a chip receiving cavity, a plurality of inner leads having a designated thickness, said inner leads arranged along opposite two sides of the chip receiving cavity, a plurality of connection terminals having a smaller thickness than that of the inner leads, each connection terminal formed on a terminal end of the inner lead, said terminal end lying adjacent to the chip receiving cavity, a plurality of outer leads integrated with the inner leads, dam bars formed perpendicular to the inner and the outer leads in order to partition leads into the inner and the outer leads, tie bards formed on opposite two sides other than the sides on which the inner leads are formed, and a side frame supporting the outer leads, the dam bars, and the tie bars;

attaching an adhesive tape to the lower surface of the lead frame;

bonding a semiconductor chip to the adhesive tape in the chip receiving cavity between the leads;

connecting the semiconductor chip to the connection terminals;

forming a package body by encapsulating the semiconductor chip, the inner leads, the connection terminals, and electrical connection parts between the semiconductor chip and the connection terminals, so as to expose the upper surfaces of the inner leads to the package body;

removing the adhesive tape;

removing dam bars from the side frame;

separating packages from the lead frame; and forming a stacked package by stacking a plurality of the packages, wherein each of the packages is stacked on another package by electrically connecting the exposed upper and lower surfaces of the inner leads with each other, and the stacked package is electrically connected to an external printed circuit board by outer leads of a lowermost package.

2. The method of claim 1, wherein the connection terminals are formed by half-etching the upper surfaces of the terminal ends of the inner leads.

3. The method of claim 2, wherein the connecting the semiconductor chip to the connection terminals comprises electrically connecting the semiconductor chip to the connection terminals of the inner leads by a metal wire, and a depth of the half-etching is greater than a wire loop height so that the metal wire is embedded by the package body.

4. The method of claim 3, wherein in said connecting the semiconductor chip to the connection terminals, the metal wire is wedge-bonded to the semiconductor chip and the connection terminals of the inner leads, respectively.

5. The method of claim 1, wherein said connecting the semiconductor chip to the connection terminals comprises:

forming a metal ball on each of electrode pads of the chip; and electrically connecting the metal balls of the chip to the connection terminals by the reflow soldering.

6. The method of claim 1, wherein the lead frame includes a lower lead frame and an upper lead frame, said lower lead frame having the same thickness of that of the connection terminal and said upper lead frame having an opening for exposing the connection terminals.

7. The method of claim 1, wherein said separating the package from the lead frame comprises:

cutting the outer leads from the side frame and bending the outer leads to be mounted on the external printed circuit board; and separating individual semiconductor device package from the lead frame by cutting the tie bars from the side frame, wherein the separated semiconductor package is the lowermost package of the stacked package.

8. The method of claim 7, wherein the outer leads of the lowermost package are bent in gull-wing type.

9. The method of claim 1, wherein said separating the package from the lead frame comprises:

cutting the inner leads from the outer leads; and separating individual semiconductor device packages from the lead frame by cutting the tie bars from the side frame, wherein the semiconductor package is stacked on the lowermost package of the stacked package.

10. The method of claim 1, further comprising plating the exposed upper and lower surfaces of inner and the surfaces of the outer leads with a Sn-Pb alloy, after said removing the dam bars.

11. The method of claim 10, wherein in said forming the stacked package, the inner leads of a package are bonded to the inner leads of another package by the reflow soldering.

12. The method of claim 1, wherein in said forming the stacked package, the inner leads of a package are bonded to the inner leads of another package by applying a solder paste on the exposed upper surfaces of the inner leads and reflow soldering the applied solder paste.

* * * * *